United States Patent
Wei (10) Patent No.: US 7,110,311 B2
(45) Date of Patent: Sep. 19, 2006

(54) SENSE AMPLIFIER FOR REDUCED SENSE DELAY IN LOW POWER MODE

(75) Inventor: Wei Wei, Santa Clara, CA (US)

(73) Assignee: Atmel Corporation, San Jose, CA (US)

( * ) Notice: Subject to any disclaimer, the term of this patent is extended or adjusted under 35 U.S.C. 154(b) by 161 days.

(21) Appl. No.: 10/869,325

(22) Filed: Jun. 15, 2004

(65) Prior Publication Data

US 2005/0276137 A1    Dec. 15, 2005

(51) Int. Cl.
     *G11C 7/02*      (2006.01)

(52) U.S. Cl. .................. 365/207; 365/149; 365/189.05; 365/189.06

(58) Field of Classification Search ................ 365/207, 365/149, 189.05, 189.06
See application file for complete search history.

(56) References Cited

U.S. PATENT DOCUMENTS

| | | | |
|---|---|---|---|
| 4,951,252 A * | 8/1990 | White et al. ............ | 365/189.11 |
| 5,815,452 A * | 9/1998 | Shen ........................ | 365/207 |
| 6,137,741 A * | 10/2000 | Liu .......................... | 365/208 |
| 6,473,356 B1 | 10/2002 | Raszka ................... | 365/230.03 |
| 6,518,798 B1 | 2/2003 | Telecco ................... | 327/54 |
| 6,535,025 B1 | 3/2003 | Terzioglu et al. ........ | 327/51 |
| 6,700,415 B1 | 3/2004 | Telecco ................... | 327/54 |
| 6,912,167 B1 * | 6/2005 | Tam ......................... | 365/207 |
| 2003/0035334 A1 | 2/2003 | Terzioglu et al. ......... | 365/207 |

* cited by examiner

Primary Examiner—Richard Elms
Assistant Examiner—N Nguyen
(74) Attorney, Agent, or Firm—Schneck & Schneck; Thomas Schneck (57) ABSTRACT

A sense amplifier has a charge sharing compensator to eliminate wake-up delays in an output signal. The charge sharing compensator comprises a capacitor or a charge storing means to compensate for charges in a charge sharing path that has two different voltage potentials. The compensator also has a transistor for selecting a signal path to transfer charges from the capacitor, eliminating charge sharing in the bit line path of the sense amplifier. Another aspect of the present invention is a method for resolving charge sharing problems that comprises steps of choosing a proper value for a compensating capacitor, choosing a control signal for a charge sharing compensation means, and clamping down an input terminal of the sense amplifier.

23 Claims, 7 Drawing Sheets

SENSE AMPLIFIER FOR REDUCED SENSE DELAY IN LOW POWER MODE

TECHNICAL FIELD

The present invention relates generally to a sense amplifier in a memory device. More specifically, the present invention relates to a sense amplifier with a means for resolving a charge-sharing problem that causes significant signal propagation delay in low power mode.

BACKGROUND ART

Sense amplifiers are one of the most critical circuits in a periphery of memory devices. They are used to sense data information from an array of cells in a memory device. The sense amplifier's performance strongly affects both memory access time and overall function of the memory device. As with other integrated circuits, memory devices are required to become increasingly faster. Sense amplifiers are also required to become commensurately faster.

The sense amplifier detects a high or a low data value, differing by a small voltage, presents the value found in a proper level for a correct logic level representation outside the memory, and is quickly ready to repeat this read process for the next memory location. To do this, a sense amplifier must be able to detect a difference between a high and a low level in a storage element that may be several hundred millivolts. The sense amplifier must correctly detect small voltage differences without excessive depletion or injection of charge in the storage element being sensed so that the correct level is maintained in storage and successive read operations are started rapidly. The sense amplifier must be able to provide a large enough voltage level representation to the consuming logic for a proper result. The sense amplifier must supply this result with a small propagation delay to maintain quick memory access and high throughput. To provide high throughput, the memory device must be able to cycle quickly through these requirements each time a new memory location is read.

An input node of a sense amplifier is typically connected directly to a bit-line of a memory array, which may contain many memory cells. A total capacitance loading on the bit-line is very large. Such large capacitances result in slow input slew rates and increased signal propagation delay. Various circuit techniques have been used to reduce the signal swing on the bit-lines to achieve high-speed operation. These techniques commonly require a large DC bias current through the amplifying stages and thus are not suitable for applications requiring low stand-by DC current, which is the case in products such as battery operated consumer electronics applications. To reduce the overall energy consumed by a memory device, sense amplifiers can be conditionally turned on briefly when a content of a memory bit needs to be read out, remaining turned off otherwise, consuming zero DC current. This defines a low current operation mode, commonly referred to as Low Power Mode. Different design techniques, such as edge detection circuits, can be used to determine when to turn on the sense amplifiers. Usually, when the sense amplifier is turned off, the input node and the output node are coupled together to form a latch. This preserves the information from the last memory access. The formation of the latch places the input node at full CMOS levels. If the input node of the sense amplifier is directly coupled to the memory bit-line, which has heavy capacitive loading, the memory bit-line will also be forced to a full CMOS level. Upon subsequent memory accesses, if the content of a memory cell presents a different logic value than the previously accessed memory bit, a large voltage swing is seen on the bit-line before the sense amplifier can detect a correct logic level. This voltage swing is much larger than the voltage swing on the bit-line during normal sense amplifier operation. This larger voltage swing results in much larger propagation delays.

A prior art circuit technique isolates the heavily loaded bit-line from the sense amplifier input node during latching in Low Power Mode and only latches the sense amplifier input node to a CMOS level. This technique reduces the voltage swing seen on the bit-line when the sense amplifier wakes up. It can significantly reduce the Low Power Mode propagation delay. However, a charge-sharing path exists between the sense amplifier input node and bit-line in the prior art technique. Under certain conditions, the charge sharing path pumps up the bit-line voltage to a level significantly higher than its normal mode bias level and introduces significantly larger signal swing on the bit-line when the sense amplifier wakes up. As a consequence of a larger signal swing, the Low Power Mode signal propagation delay increases significantly. This delay decreases the effectiveness of the bit-line isolation technique.

FIGS. 1–4 illustrate an overview of a prior art sense amplifier having delay problems in the logic low signals.

Figure 1:
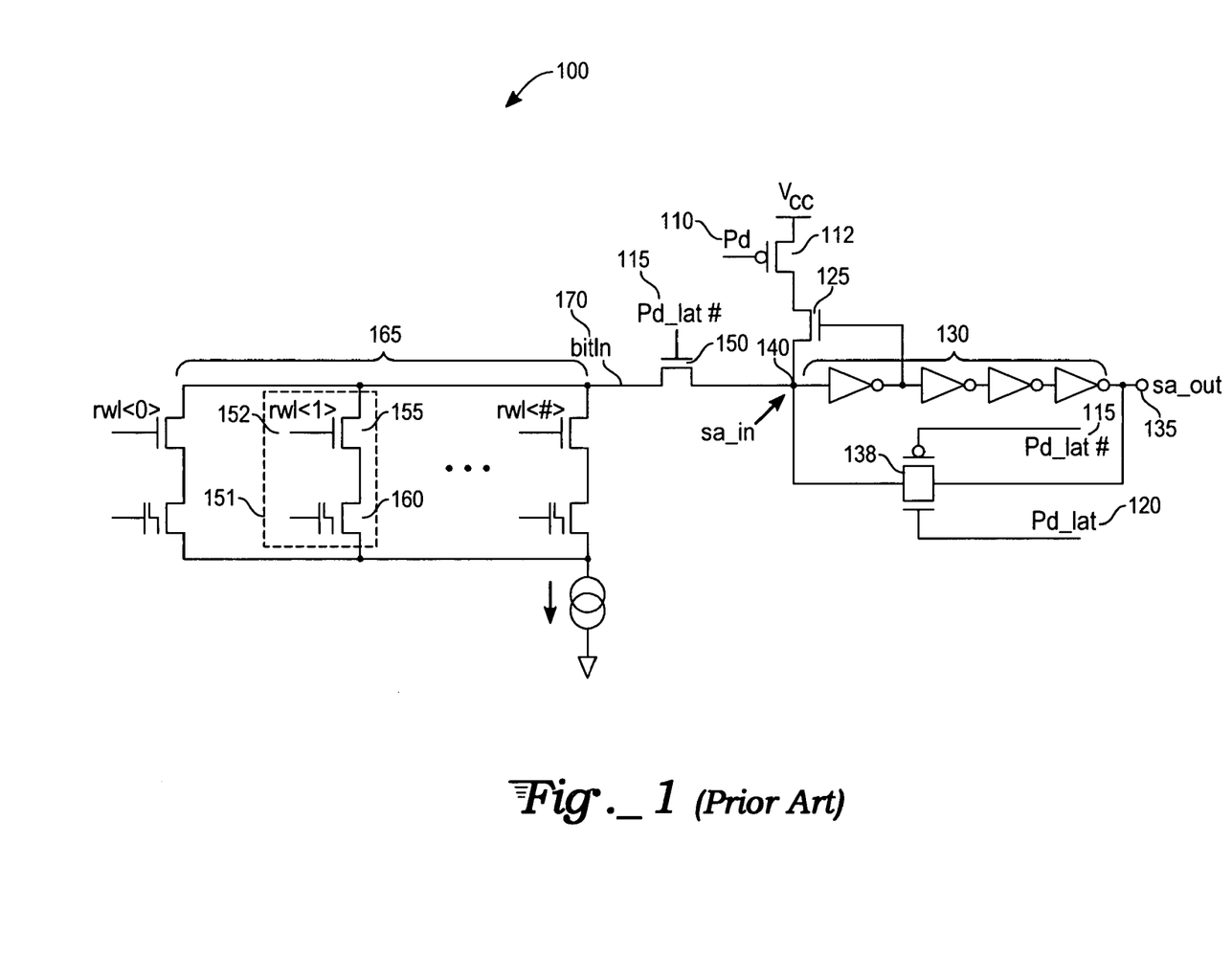
FIG. 1 illustrates a prior art schematic diagram of an integrated memory device using a sense amplifier.

With respect to FIG. 1, an exemplary embodiment of a schematic diagram of a sense amplifier 100, representative of the prior art, is shown. A memory cell 151 consists of a storage transistor 160 and a select transistor 155 connected in series. A memory cell array 165 is composed of many memory cells 151 with each select transistor 155 controlled by a separate word line 152. The memory cells 151 are connected in parallel to a bit-line 170. The bit-line 170 is connected to a sense amplifier input, sa_in 140, through a first NMOS transistor 150. The first NMOS transistor 150 is configured with a source connection to the bit-line 170, a drain connection to the sense amplifier input sa_in 140, and a gate connection to a signal Pd_lat# 115. The sense amplifier input, sa_in 140, connects to a first of four inverters 130 connected in series with the fourth inverter having an output connection to the output terminal sa_out 135. The output of the first inverter of four inverters 130 is connected to an input gate of a second NMOS transistor 125 with a source connection to sa_in 140 and a drain connection to the drain of a pull-up PMOS transistor 112. The second NMOS transistor provides feedback to the input of the sense amplifier 100 for level sensing. The source of the pull-up PMOS transistor 112 is connected to $V_{cc}$. The gate of the pull-up PMOS transistor 112 is connected to an input Pd 110 An output of the fourth inverter 130 is connected to the input of a transmission gate 138. An output of the transmission gate 138 forms a latching path when connected to sa_in 140. Pd_lat# 115 and a signal Pd_lat 120 control the latching path.

Figure 2:
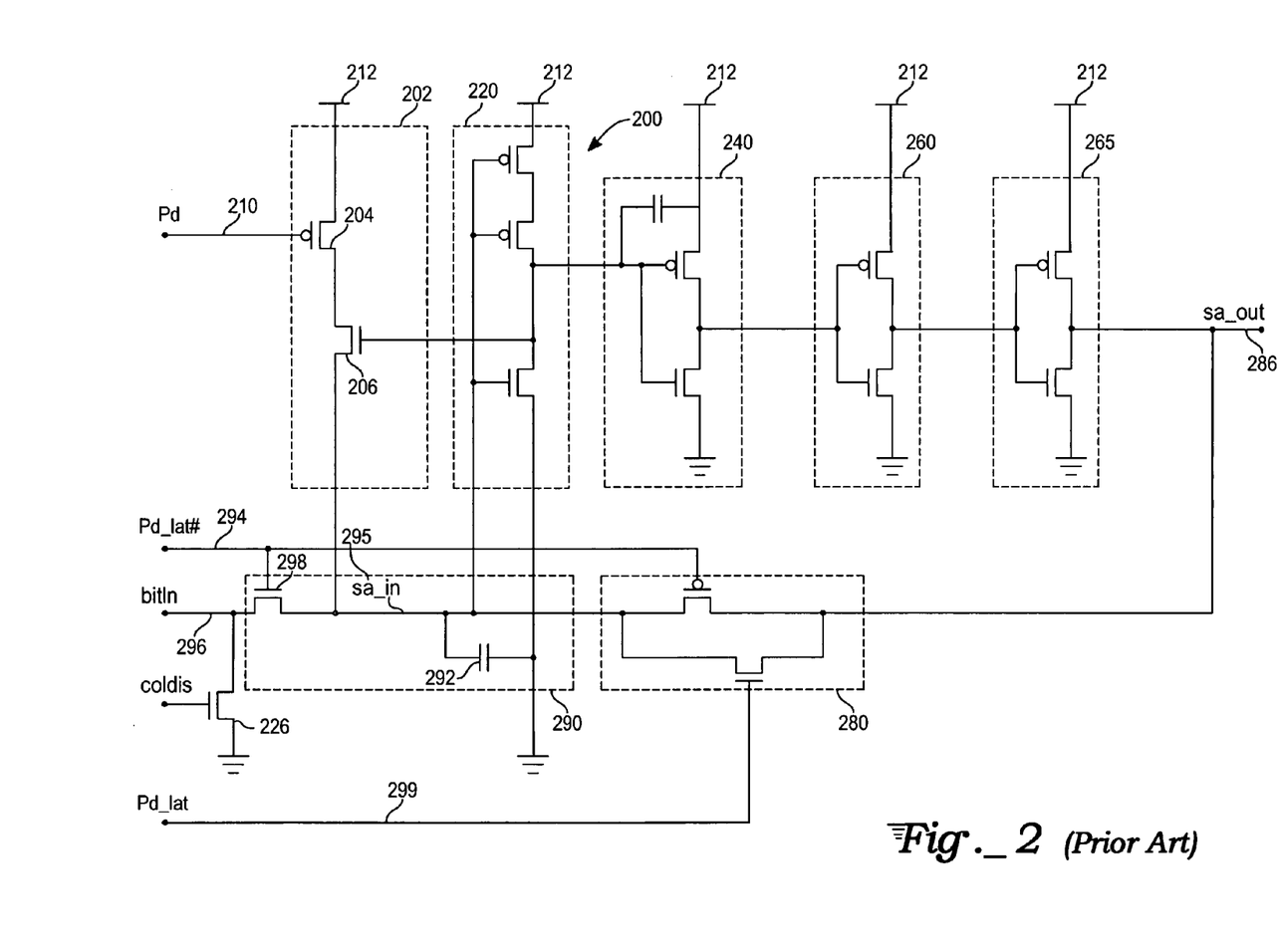
FIG. 2 illustrates a prior art schematic diagram of a sense amplifier having charge sharing problems.

With reference to FIG. 2, a detailed schematic diagram of a sense amplifier 200 is illustrated. The sense amplifier 200 comprises a biasing circuit 202, a first inverter 220, a second inverter 240, a third inverter 260, a feedback latching path 280, and a bit-line path 290.

The biasing circuit 202 sets the bias voltage level on sa_in 140 in high power mode for the sense amplifier 200 and comprises a PMOS pull-up transistor 204 coupled in series to an NMOS transistor 206. A first input terminal (Pd) 210 is coupled to the gate of the PMOS pull-up transistor 204. The source of the PMOS pull-up transistor 204 is coupled to a power supply 212. The gate of the NMOS transistor 206 is coupled to an output terminal of the first inverter 220 in form of a feedback.

The first inverter 220 is, for example, a typical CMOS inverter with two pull-up PMOS transistors and a pull-down NMOS transistor. An input of the first inverter 220 is coupled to the bit-line path 290. An output of the first inverter 220 is coupled to an input of the second inverter 240 to form a buffer. As mentioned earlier, the output of the first inverter 220 is also coupled to an input (or the gate of the NMOS transistor 206) of the biasing circuit 202 to form a feedback therewith.

The second inverter 240 and the third inverter 260 are, for example, a typical CMOS inverter with a PMOS pull-up and an NMOS pull-down transistor. The output of the fourth inverter 265 forms an output terminal 286 (sa_out) of the sense amplifier 200.

The feedback latching path 280 is, for example, a transmission gate forming a latching path which is well-known to a person of ordinary skill in the art with a PMOS transistor and an NMOS transistor coupled together in parallel. Their sources are coupled together and to the output terminal 286, their drains are coupled together and to the bit-line path 290.

The bit-line path 290 has three input terminals, an NMOS switch 298, and a parasitic capacitor 292 associated with sa_in 295. The three input terminals are a second input terminal 294 (Pd_lat#), a third input terminal 296 (bitln), and sa_in 295. The drain of the NMOS switch 298 is coupled to the third input terminal 296 (bitln). The source of the NMOS switch 298 is coupled to the input terminal of the first inverter 220, to the drain of the feedback latching path 280, and to the source of the NMOS pull-down transistor 206 of the biasing circuit 202 to form the input sa_in 295 for the sense amplifier 200.

With further reference to FIG. 2, the modes of the sense amplifier 200 are determined by the following three input signals: the first input terminal (Pd) 210, the second input signal (Pd_lat#) 294, and the fourth input signal (Pd_lat) 299. These are control signals. In a high power mode, the first input signal (Pd) 210 stays LOW, the second input signal (Pd_lat#) 294 stays HIGH, and the fourth input signal (Pd_lat) 299 stays LOW. As a result, the PMOS pull-up transistor 204 is ON, raising the input sa_in 295 of the sense amplifier 200 to a bias voltage level. When the second input terminal 294 (Pd_lat#) is HIGH and the fourth input signal 299 is LOW, the feedback latching path 280 is OFF because its PMOS transistor and NMOS transistor are both OFF. Thus, the feedback latching path 280 isolates the output terminal 286 (sa_out) from the third input terminal 296 (bitln) of the sense amplifier 200.

In the high power mode, the voltage of the third input terminal 296 (bitln) varies from a logic LOW bias voltage ($V_{bias\_Lo}$) to a logic HIGH bias voltage ($V_{bias\_HIGH}$) to turn the inverters 220, 240, 260, and 265 ON or OFF respectively. Typically, the voltage swing between $V_{bias\_LOW}$ and $V_{bias\_HIGH}$ is about 200 mV. Under this condition, the third input terminal 296 (bitln) causes the NMOS switch 298 to bias at the triode region. As such, the NMOS switch 298 acts like a resistor. These bias levels are close to the trip point of the first inverter 220. Thus, in the high power mode, the sense amplifier 200 draws a considerable amount of current. The overall standby current is very high.

In the low power mode, the first input terminal 210 (Pd) and the fourth input terminal 299 (Pd_lat) normally stay HIGH and the second input terminal 294 (Pd_lat#) stays LOW. As a result, the biasing path 202 is OFF, isolating the third input terminal 296 (bitln) from the input sa_in 295 of the sense amplifier 200. When the biasing path 202 is disabled and the feed back latching path 280 is enabled, a latch is formed. Because each node is either at voltage supply $V_{cc}$ or ground, the standby current in the low power mode is very low.

Figure 3:
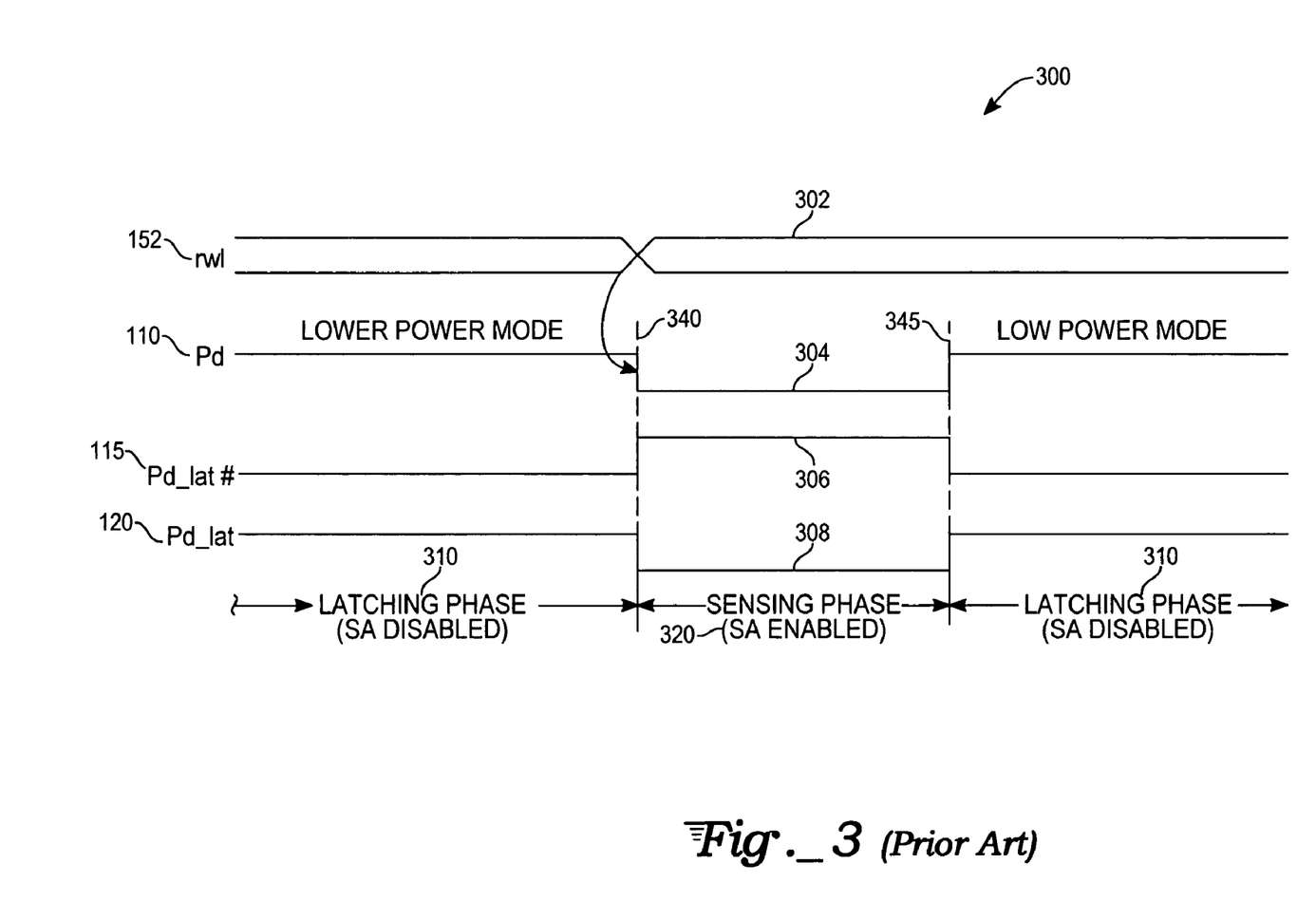
FIG. 3 illustrates a timing diagram of control signals for the prior art sense amplifier of FIG. 1.

FIG. 3 shows a timing diagram of a plurality of control signals 300 operating the prior art sense amplifier of FIG. 1. Commencing in a latching phase 310, the signal Pd 110 is high and the conductive path to $V_{cc}$ of pull-up PMOS transistor 112 is disabled. The signal Pd_lat 120 is high and Pd_lat# 115 is low. The signals Pd_lat 120 and Pd_lat# 115 in this condition will enable the latching path of the transmission gate 138, which connects sa_out 135 to sa_in 140, to make a latching condition. The low signal on Pd_lat# 115 applied to the gate of the first NMOS transistor 150, will isolate the memory cell array 165 from sa_in 140. In this latching phase 310, the latching path is enabled and the sense amplifier is disabled. This set of conditions defines the Low Power Mode.

When a memory location is to be read, a sensing phase 320 is entered. The sensing phase 320 is initiated by the word line 152 going to a high level for a memory cell 151 being selected, causing a sensing transition 340 to the sensing phase 320. The sensing transition 340 is defined by the input Pd 110 transitioning from high to low, the signal Pd_lat# 115 changing from low to high, and the signal Pd_lat 120 changing from high to low. Pd_lat 120 at a low level and Pd_lat# 115 at a high level will turn off the latching path from sa_out 135 to sa_in 140. Pd 110 being low will enable the pull-up PMOS transistor 112 to conduct and provide a bias to the sense amplifier input sa_in 140. A high level on Pd_lat# 115 is applied to the gate of the first NMOS transistor 150, making a coupling path from the memory cell array 165 to sa_in 140. The memory cell 151 selected is connected to the bit-line 170 through the activation of the select transistor 155. The contents of the selected memory cell are available to be coupled to the sense amplifier input sa_in 140 through the first NMOS transistor 150. In this phase, the latching path is disabled and the sense amplifier is enabled.

When the sensing phase 320 is concluded, a latching transition 345 is initiated by control logic (not shown). This transition is marked by the signal Pd 110 changing from low to high, the signal Pd_lat# 115 changing from high to low, and the signal Pd_lat 120 changing from low to high. In this phase the sense amplifier 100 is disabled and the latching path is active.

FIG. 3 also illustrates the timing diagram of these prior art control signals during a wake-up event 302. The sense amplifier 200 awakens by related signals that cause any separate word line 152 (FIG. 1) to change state. The change in state of these signals produces short pulses in the control signals. Graph 302 represents either input signals or feedback signals that change state from HIGH to LOW or vice versa. This causes the signal at the first input terminal 210 (Pd) to go LOW, creating a pulse 304. It also causes the signal at the second input terminal 294 (Pd_lat#) to become HIGH, representing pulse 306. Finally, the fourth signal 299 (Pd_lat) responds by having a pulse 308.

These pulses 304, 306, and 308 are about 20 ns in duration. During the short pulses, the first input terminal 210 (Pd) and the fourth input terminal 299 (Pd_lat) go LOW, and the fourth input signal 299 (Pd_lat#) goes HIGH. During these pulses, the sense amplifier 200 is enabled and the feedback latching path 280 is OFF. The sense amplifier 200 goes into the high power mode. That is, the sense amplifier 200 evaluates the possible new voltage levels created by the changes on input or feedback signals and responds to these changes. Once the pulse is over, the updated information is latched and stored until a next input or feedback transition.

During an initial sense phase 320, for a memory bit storing a logic high, a $V_{bias\_HIGH}$ voltage is present on the bit-line. After the sense amplifier switches to latch phase 310 after the wake up window expires, the bit-line node is isolated from the sa_in node. If we neglect the leakage current from the bit-line to ground, the bit-line holds the $V_{bias\_HIGH}$ voltage due to its electrical capacitance. The sa_in node is coupled to sa_out node because the formation of a latching connection during the latch phase 310. During the latch phase 310 a logic one, at a full CMOS level, is present at sa_in. In this case, a $V_{cc}$ voltage level is present on sa_in. The second time the sense amplifier switches from latch phase 310 to sense phase 320 transistor 298 in FIG. 2 turns on since Pd_latch# goes to high during the sense phase 320. This couples sa_in and the bit-line together. At the onset of coupling, sa_in has a $V_{cc}$ level stored on its associated parasitic capacitor 292. The bit-line node has a $V_{bias\_HIGH}$ level stored in its associated capacitance. Since $V_{cc}$ usually is much higher than $V_{bias\_HIGH}$, the charge in each capacitor redistributes to reach an equilibrium voltage. This process will conclude when there is no potential difference between these two nodes. The total amount of charge remains the same under the law of charge conservation. The final equilibrium voltage on the bit-line during the second sense high is higher than the original $V_{bias\_HIGH}$ voltage. In the subsequent latch phase 310, the higher voltage level is preserved on the bit-line, while sa_in is coupled back to $V_{cc}$ due to the latching action. With a third sensing cycle, charge redistribution occurs again if the new bit-line voltage is lower than $V_{cc}-V_T$, where VT is the threshold voltage of transistor 298. As a result, the bit-line goes to a level even higher voltage than the second time.

Figure 4:
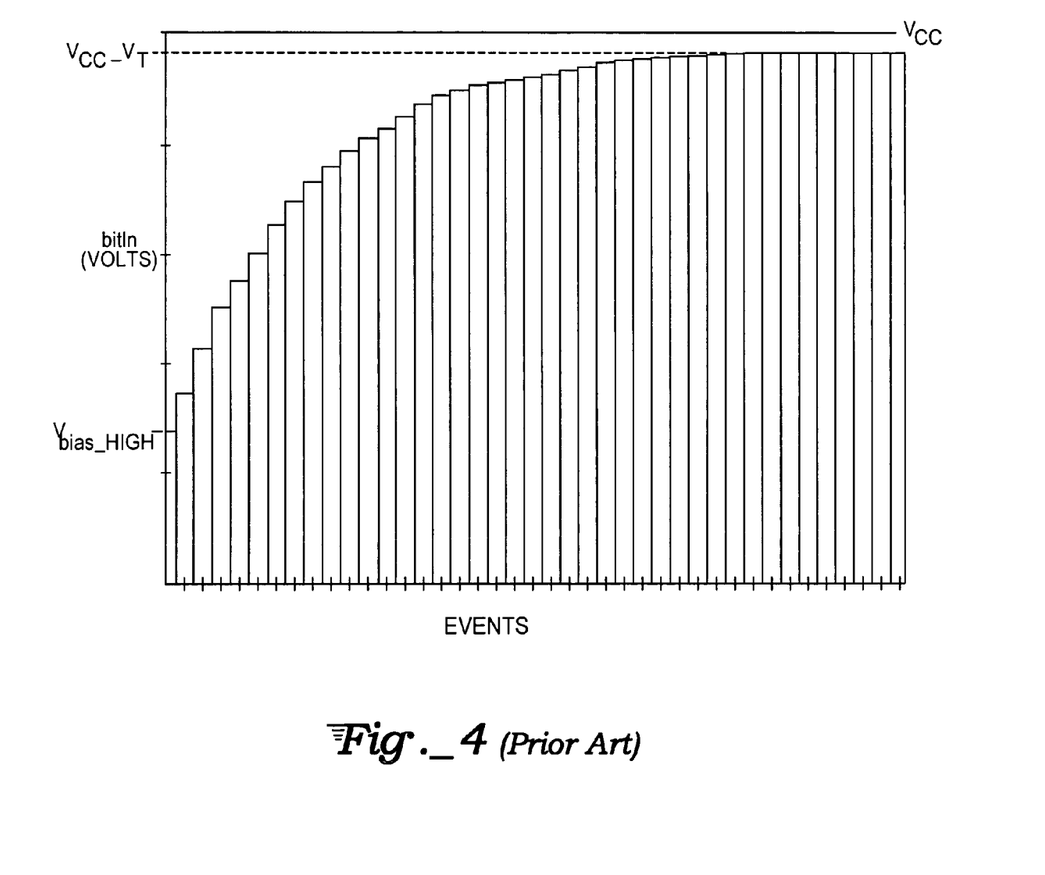
FIG. 4 illustrates an input signal of the prior art sense amplifier in FIG. 2 when input control signals are changed as illustrated in FIG. 3.

With regard to FIG. 4, continuing sensing phase events, pump the bit-line voltage even higher. If there are enough sensing cycles, the bit-line voltage level will eventually reach a saturated level at $V_{cc}-V_T$. At this stage, even thought there is still a potential difference between sa_in and the bit-line node, the transistor 298 cannot be turned on to establish a conducting path to redistribute the charge. Because the third input terminal 296 (bitln) is pumped to a voltage level higher than a normal bit-line high bias voltage level, the following sensing logic low speed gets slowed down drastically. Normally, the voltage of bit-line path 290 only travels from about 100 mV to 200 mV to sense a logic LOW. Now it has to travel more than 2 volts to finally reach the voltage level for a sense amp to recognize a logic LOW. Because of the heavy loading on the bit-line path 290, it takes significantly more time to sense a logic LOW. This type of delay causes both functional failure and the failure to meet TPD specification.

What is needed is a circuit technique that reduces the effects of charge pumping events and achieves high-speed operation in the Low Power Mode.

SUMMARY OF THE INVENTION

Accordingly, one embodiment of the present invention is achieved by a sense amplifier with a charge sharing compensator in the form of an electrical charge storage means and/or a voltage clamping means.

The sense amplifier switches between a latching phase and a sensing phase. A charge sharing problem results when successive high logic levels are read (sensed) and stored (latched) into the sense amplifier. In a latching phase, an input and an output of the sense amplifier are coupled together. During this phase, an input capacitance of the sense amplifier is charged to a high potential when a high logic level is stored. In a sensing phase, a memory array bit-line is coupled to the input of the sense amplifier. At the commencement of the sensing phase, for a high logic level stored in the memory array, a capacitance of the bit-line, at a moderate level potential, is coupled to the sense amplifier input capacitance at a high level potential. This difference in potential forms a charge-sharing path at an onset of coupling under the law of charge conservation. After one or more successive reading and storing operations at high logic levels, the memory array bit-line will become pumped up with excessive charge. This will raise a bit-line voltage potential higher than the bias high voltage. A bit-line potential of this magnitude causes prolonged propagation delays or errors for any subsequent logic low levels sensed. The electrical charge storage means and/or the voltage clamping means compensate for the pumping up of a voltage on the memory array bit-line.

The charge sharing compensator also has a means for selecting a conductive path to the bit-line to an electrical charge storage means when the sense amplifier switches between latch and sense phase. It cancels the excess charge on the bit-line node after each cycle of reading and storing successive logic high quantities, keeping the bit-line voltage level close to the normal bias high level. When a proper value of the electrical charge storage means is selected, excess charge on the bit-line can be fully compensated.

Another aspect of the invention is a method for eliminating the charge sharing problems that includes steps of choosing a proper value for a compensating capacitor, choosing a control signal for the compensating capacitor, and clamping a memory bit-line.

BEST MODE FOR CARRYING OUT THE INVENTION

Figure 5:
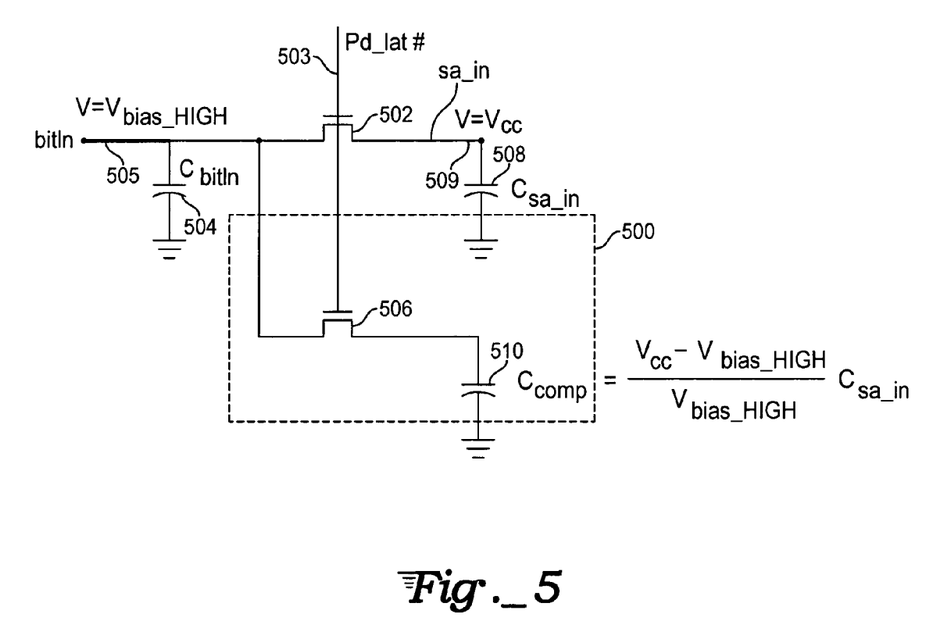
FIG. 5 illustrates a schematic diagram of a charge compensator, which can be used to eliminate the charge sharing problems in accordance with the present invention.

With respect to FIG. 5, an exemplary embodiment of a charge compensator 500 for eliminating the charge sharing problems of the prior art is illustrated. The charge compensator 500 is actually a second charge sharing path that is used to compensate any charge shared between a capacitance of a third input terminal 505 (bitln) and that of the sense amplifier input terminal sa_in 509. The charge compensator 500 comprises a switching transistor 506 coupled to a compensating capacitor 510. The value of the compensating capacitor 510 is calculated according to the principle of charge conservation and proportional to the supply voltage $V_{cc}$, details of which are provided infra.

At an initial state, when a transistor 502 is OFF, the capacitor $C_{bitln}$ 504 of the third input terminal 505 (bitln) holds a logic HIGH bias voltage ($V_{bias\_HIGH}$) and the sense amplifier's input capacitor $C_{sa\_in}$ 508 holds the supply voltage, $V_{cc}$. When the second input terminal 503 (Pd_lat#) changes its state to HIGH, the transistor 502 is ON. The charge conservation principle states that there should be no voltage difference between the source and drain of the transistor 502. As a result, a new voltage $V_x$ appears on both the third input terminal 505 (Pd_lat#) and a sense amplifier input node sa_in 509. This new voltage value can be calculated by using the law of charge conservation:

$$C_{bitln}*V_{bias\_HIGH}+C_{sa\_in}*V_{cc}=C_{bitln}*V_x+C_{sa\_in}*V_x$$

which results in:

$$V_x = \frac{C_{bitln}*V_{bias\_HIGH} + C_{sa\_in}*V_{cc}}{C_{sa\_in} + C_{bitln}}$$

For the next sensing high, $$V_{x+1} = \frac{C_{bitln}*V_x + C_{sa\_in}*V_{cc}}{C_{sa\_in} + C_{bitln}}$$

This continues until in the limit:

$$V_{x+n}=V_{cc}-V_T, \text{ as n approaches infinity.}$$

With a compensation capacitance $C_{comp}$ 510 in use, another storage cell containing a low level will be compensated when coupled to bitln 505 under the same principle of charge conservation. When $$C_{comp} = \frac{(V_{cc} - V_{bias\_HIGH})*C_{sa\_in}}{V_{bias\_HIGH}},$$

the excessive charge on sa_in 509 is fully canceled and the voltage on bitln 505 remains at $V_{bias\_high}$.

Thus, the second charge-sharing path 500 compensates for the charge injection caused by the first charge-sharing path. When the NMOS transistor 502 and the switching transistor 506 are OFF, the third input terminal's capacitor 504 ($C_{bitln}$) is at a logic HIGH bias voltage ($V_{bias\_HIGH}$), the sense amplifier's input capacitor 508 ($C_{sa\_in}$) is at the supply voltage level $V_{cc}$, and the compensating voltage on $C_{comp}$ 510 is at a ground level. When the NMOS transistor 502 and the switching transistor 506 are turned ON, a new equilibrium voltage is reached and equals $V_{bias\_HIGH}$ with $C_{comp}$, derived supra.

The second charge sharing path 500 with the NMOS switching transistor 506 and compensating capacitor 510 can be integrated into the sense amplifier 200 to eliminate the charge sharing problems discussed herein.

Figure 6:
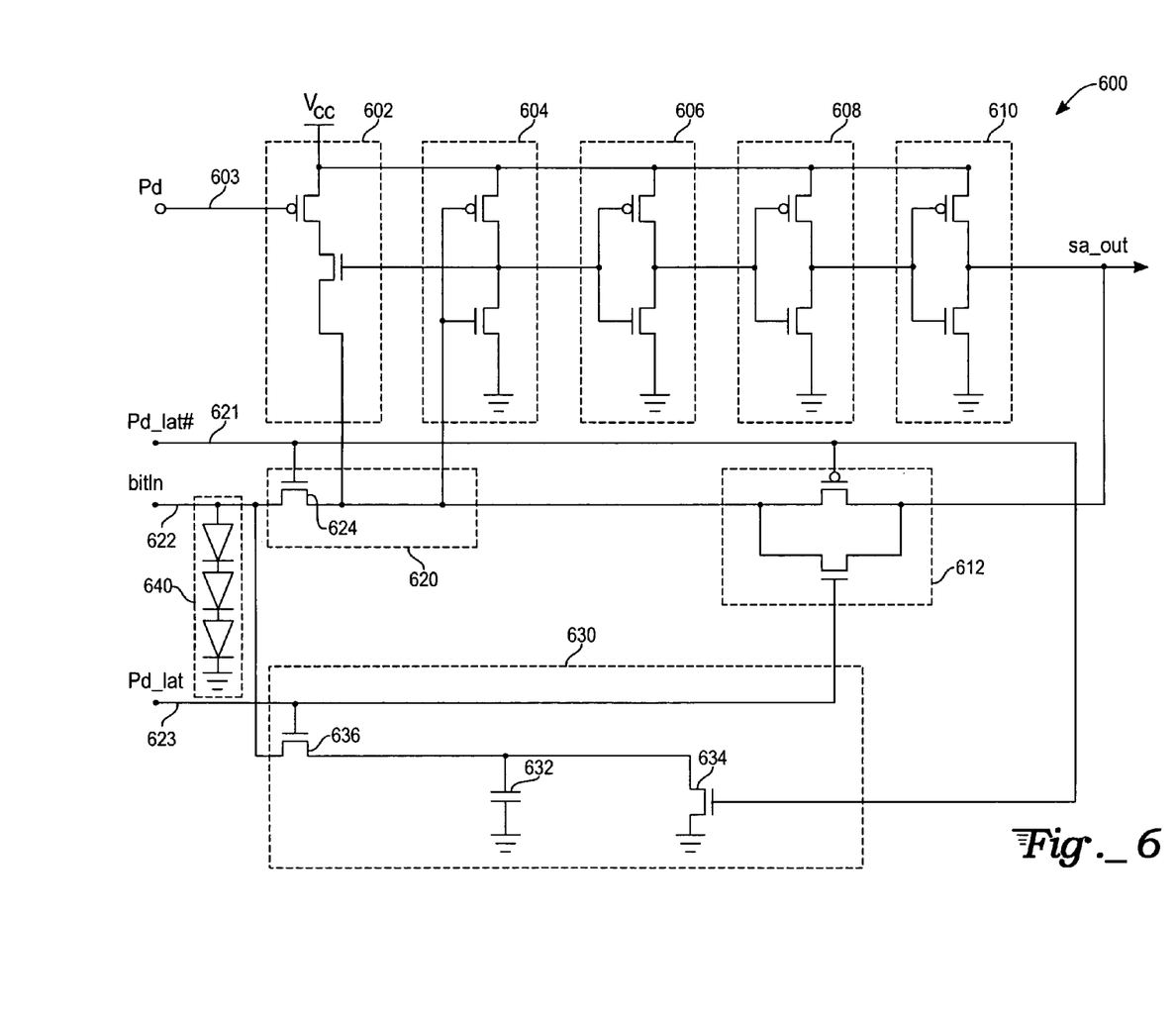
FIG. 6 illustrates a schematic diagram of a sense amplifier equipped with a charge compensator in accordance with the present invention.

With reference to FIG. 6, an exemplary embodiment of a sense amplifier 600 incorporates the charge compensator 500 of FIG. 5. The sense amplifier 600 with the charge sharing compensator 500 comprises a bit-line biasing path 602 having a first input terminal (Pd) 603, a plurality of inverters 604, 606, 608, and 610 coupled to bit-line biasing path 602, a feedback latching path 612 having a second input terminal 621 (Pd_lat#), a third input terminal 622 (bitln), and a fourth input terminal 623 (Pd_lat). The feedback biasing path 612 is coupled to the bit-line biasing path 602 and the plurality of inverters 604, 606, 608, and 610. A charge sharing compensator 730 coupled to the feedback latching path 612 compensates for charge stored in a charge sharing path 620 formed between the third input terminal 622 (bitln) and the feedback latching path 612.

The sense amplifier 600 has a charge sharing path or a charge sharing compensator 630 to minimize the charge sharing problems of the prior art. In addition, the sense amplifier 600 also has a plurality of voltage clamping diodes 640 coupled to the third input terminal 622 (bitln). As shown in FIG. 6, the charge sharing compensator 630 comprises a compensating capacitor 632 for storing charges to compensate for electrical charges in the charge sharing path 620. The charge sharing compensator 630 also comprises an NMOS transistor 636 coupled to the third input terminal 622 (bitln), and a second NMOS transistor 634 coupled to the PMOS transistor of the feedback latching path 612. The value of the compensating capacitor 632 is calculated using the equation, supra, derived from the principle of charge conservation. Further, another difference between the sense amplifier 600 and the prior art is the plurality of voltage clamping diodes 640 at the third input terminal 622 (bitln). The plurality of voltage clamping diodes 640 ensures that the voltage at the third input terminal 622 (bitln) will not exceed the compensating capability of the compensating capacitor 632 ($C_{comp}$) A method for choosing the proper value of the compensating capacitor 632 ($C_{comp}$) and the clamping diodes 640 are discussed below in another aspect of the present invention.

Figure 7:
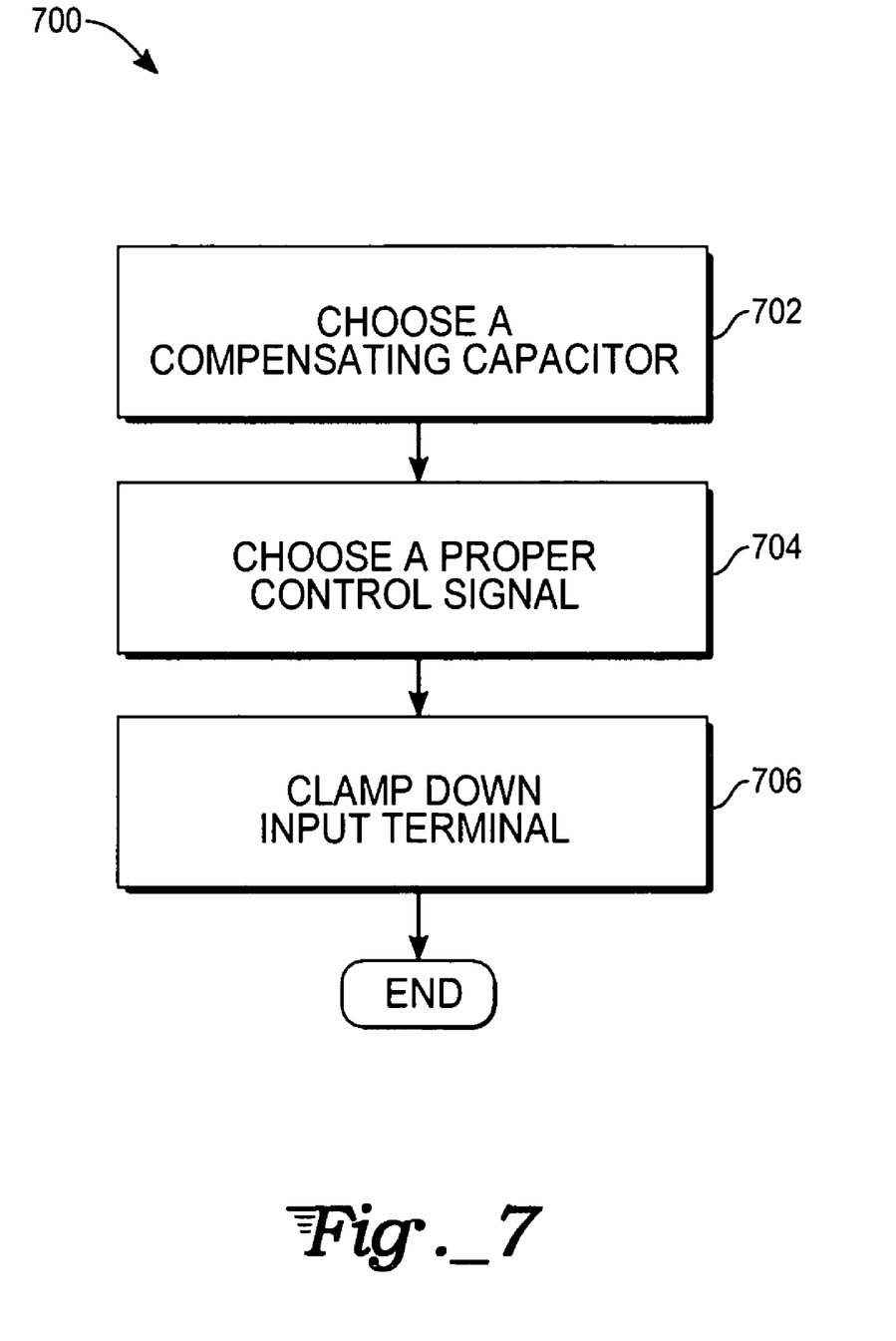
FIG. 7 illustrates a flow chart of a method for eliminating the charge sharing problems in accordance with the present invention.

FIG. 7 shows a flowchart 700 of an exemplary method for eliminating charge sharing problems of the prior art that cause significant delays in the logic level low to be propagated in a sense amplifier. When the sense amplifier changes input states due to additional wake-up signals, the charge sharing between the input signal and the feedback latching path causes a significant delay to low level logic signals. The method shown in flow chart 700 for solving this problem includes three main steps: choosing 702 a proper value for a compensating capacitor 632 (FIG. 6), choosing 704 a proper control signal to divert sharing charge to the compensating capacitor 632, and choosing a method for clamping 706 the input signal voltage so that the input potential does not create more sharing charge than the compensating capacitor 632 can handle. One skilled in the art will recognize that these steps can be performed in any order and performed to select, in the alternative, the compensating capacitor 632 and/or the voltage clamping means.

At step 702, choosing a proper value for the compensating capacitor 632 is performed. As discussed herein, the compensating capacitor 632 is a function of the sense amplifier input capacitance, voltage supply $V_{cc}$, and the logic HIGH bias voltage ($V_{bias\_HIGH}$). Because the sense amplifier input capacitance ($C_{sa\_in}$) does not change with the supply voltage $V_{cc}$, the compensating capacitor ($C_{comp}$) is only affected by the logic HIGH bias voltage ($V_{bias\_HIGH}$) and the supply voltage $V_{cc}$. Because the logic HIGH bias voltage ($V_{bias\_HIGH}$) is approximately proportional to the supply voltage $V_{cc}$ the compensating capacitor 632 does not need to be adjusted significantly across the expected range of supply voltage $V_{cc}$. However, in order to achieve a good value for the compensating capacitor 632, different values of the compensating capacitor 632 ($C_{comp}$) should be calculated based on high power mode data. A proper value for the compensating capacitor 632 ($C_{comp}$) should be slightly larger than a largest value for the compensating capacitor 632 calculated from the equation given above, viz:

$$C_{comp} = \frac{V_{cc} - V_{bias\_HIGH}}{V_{bias\_HIGH}} C_{sa\_in}$$

Additionally, in order to choose a proper value for the compensating capacitor 632 ($C_{comp}$), a temperature effect should also be considered. A slightly larger than maximum compensating capacitor would pump down the value of the logic HIGH bias voltage ($V_{bias\_HIGH}$) slightly. Therefore, as commonly practiced by one skilled in the art, to ensure that pumping down will not generate a zero glitch in the output signal, a simulation of a logic-one to logic-one succession should be performed at a maximum expected supply voltage $V_{cc}$, with some wake-up events in between, and at a temperature corner that yields the smallest compensating capacitor value.

At step 704, choosing the control signal to select the correct compensating charge sharing path is performed. There are two possible control signals that can be chosen. The first one is the second input terminal 621 (Pd_lat#). As shown in FIG. 6, this control signal (Pd_lat#) controls the charge sharing path 620. In this case, both charge sharing paths are turned ON and OFF simultaneously. In practice, this control signal (Pd_lat#) adds capacitive loading from the second path to the third input terminal 622 (bitln) during High Power Mode sensing. This results in a slow down of the speed of the sense amplifier 600. In Low Power Mode, the control signal for the switching transistor is a pulse, the charge sharing from the NMOS transistor 624 occurs at the beginning of the pulse.

The second control signal possibility is to use the fourth input signal (Pd_lat), which is complementary to the third input signal (Pd_lat#). If the fourth input signal (Pd_lat) is used, when it is HIGH, transistor 636 is ON. Equivalently, when transistor 622 is ON, transistor 636 is OFF. Therefore, in High Mode, when the transistor 624 is always ON, there is only a small capacitance from transistor 636 added to the signal at the third input terminal (bitln) 622. Thus, the High Mode speed penalty is kept at a minimum. In Low Power mode, a rising edge of the second input signal (Pd_lat#), the first charge sharing path is ON, charging the third input terminal 622 (bitln) to a higher value. At the falling edge of the second input 621 (Pd_lat#), the second charge sharing path 630 is ON and pulls the voltage on the third input terminal 622 (bitln) back to the logic HIGH bias voltage ($V_{bias\_HIGH}$). So the voltage of the third input 622 (bitln) is recovered before the next input transition. Because it takes a finite time for the charge sharing and charge redistribution to happen, when the next input transition happens so fast, the recovery might not be 100% complete. This happens when an adjacent sense amplifier input is switching at a period slightly larger than a pulse width at the first input terminal (Pd). In this case, a slightly random pulse is desirable. For example, a 40 nanosecond window with 5 nanosecond jitter at the rising edge will typically cover this problem.

Finally, at step 706, the signal at the third input terminal 622 (bitln), is clamped down by the plurality of diodes 640 to ensure the third input signal (bitln) will not get pumped too high due to a smaller than expected compensating capacitor 632 or an ineffective charge recovery at a corner frequency. A plurality of diodes 640 is added in series to the third input terminal 622 (bitln) to safeguard the voltage so it will not exceed the turn on voltage of the plurality of diodes 640. In other words, without clamping, the voltage at the third input terminal 622 (bitln) can render the compensating capacitor 632 ineffective. The effectiveness of the plurality of diodes 640 can be affected by the sense amplifier's input capacitance ($C_{sa\_in}$), the value of the third input signal's capacitance ($C_{bitln}$), any adjacent sense amplifier input signal's switching frequency, and the I/V characteristic curve of the plurality of diodes 640.

When choosing elements for the plurality of diodes 640, the following factors should be examined.

The turn on voltage of the plurality of diodes 640 should be higher than the logic HIGH bias voltage ($V_{bias\_HIGH}$) at the highest operational voltage supply range so that the plurality of diodes 640 will not interfere with the normal sensing logic-high operation. This is because the bias HIGH voltage ($V_{bias\_HIGH}$) is dependent of the supply voltage $V_{cc}$. The threshold voltage of the plurality of diodes 640 is independent of the supply voltage $V_{cc}$. Temperature factors should also be considered, as discussed supra.

Another factor to be considered is the highest logic HIGH bias voltage ($V_{bias\_HIGH}$) Since the highest logic HIGH bias voltage ($V_{bias\_HIGH}$) is higher at a high supply voltage ($V_{cc}$), sensing the logic low gets penalized more at a lower supply voltage ($V_{cc}$) if a charge pumping event happens. At a lower supply voltage ($V_{cc}$), the sensing speed is already slow. Thus, to keep the penalty at a minimum, the turn on voltage of the plurality of diodes 640 should stay as close to the highest logic HIGH bias voltage ($V_{bias\_HIGH}$) as possible.

One skilled in the art will recognize that other embodiments can readily be contemplated without departing from the intended scope of the present invention. For example, the switch circuits 634 and 636 of FIG. 6 are described in terms of NMOS transistors. However, a skilled artisan will recognize that other types of transistors may be supplemented while still achieving the same overall effect. In another example, an electrical charge storing means is described in terms of a capacitor. However, transistors connected as charge storage can be used. Therefore, the scope of the present invention shall only be limited by the appended claims.

What is claimed is:

1. A charge sharing compensator, comprising:
   an electrical charge storing means for compensating electrical charge on a bit-line;
   a first switching means for shunting said electrical charge storing means during a sensing phase of a sense amplifier;
   a second switching means for coupling said bit-line to said electrical charge storing means during a latching phase of said sense amplifier; and
   a third switching means for coupling said bit-line to said sense amplifier during said sensing phase.

2. The charge sharing compensator of claim 1 wherein a magnitude of said charge storing means is proportional to a supply voltage of said sense amplifier.

3. The charge sharing compensator of claim 1, further comprising a voltage limiting means for clamping said bit-line to a selected voltage level greater than a maximum level of an input voltage sensed by said sense amplifier.

4. A sense amplifier with a charge sharing compensator, comprising:
   a bit-line biasing path having a first input terminal;
   a plurality of inverters coupled to said bit-line biasing path;

a feedback latching path having a second input terminal and a fourth input terminal coupled to said bit-line biasing path and said plurality of inverters;

a bit-line path having a third input terminal, and coupled to said feedback and latching path; and a charge sharing compensator coupled to said bit-line path configured to compensate for electrical charge stored therein.

5. The sense amplifier of claim 4 wherein said bit-line biasing path further comprises:

a PMOS transistor coupled in series to an NMOS transistor; a gate of said PMOS transistor coupled to said first input signal;

a source of said PMOS transistor coupled to a drain of said NMOS transistor; and a gate of said NMOS transistor coupled to said plurality of inverters.

6. The sense amplifier of claim 4 wherein said plurality of inverters further comprises:

a first inverter coupled in series to a second inverter, a third inverter, and a fourth inverter;

an output terminal of said first inverter being coupled to an input of said second inverter, an output terminal of the second inverter being coupled to an input of said third inverter, and an output terminal of said third inverter being coupled to an input terminal of said fourth inverter; and an output terminal of said fourth inverter forming an output terminal of said sense amplifier.

7. The sense amplifier of claim 4 wherein said feedback latching path further comprises an NMOS transistor coupled in parallel to a PMOS transistor.

8. The sense amplifier of claim 4 wherein said bit-line path further comprises a switching transistor coupled to an input capacitor of said sense amplifier.

9. The sense amplifier of claim 4 wherein said charge compensator further comprises:

means for storing electrical charge to compensate for electrical charge in a charge sharing path formed between an input terminal and a feedback latching path of a sense amplifier; and means for selecting a signal path to transfer electrical charge from said input terminal and said feedback latching path to said storing means when either input signals or feedback signals of said sense amplifier change state.

10. The sense amplifier of claim 9 wherein said charge storing means is a capacitor whose value is proportional to a supply voltage of said sense amplifier.

11. The sense amplifier of claim 9 wherein said signal path selecting means is a plurality of transistors.

12. The sense amplifier of claim 11 wherein said plurality of transistors comprises a first NMOS transistor coupled to said input terminal of said sense amplifier and a second NMOS transistor coupled to said latching path of said sense amplifier.

13. A sense amplifier with a charge sharing compensator, comprising:

a biasing means for producing a voltage level at an input of said sense amplifier;

a buffering means for amplifying a voltage level sensed on said bit-line by said buffering means;

a feedback means for latching an output signal of said sense amplifier to an input terminal of said buffering means; and a compensating means for neutralizing electrical charge on a bit-line, the bit-line associated with said sense amplifier, said compensating means further comprising an electrical charge storing means for offsetting electrical charge on a bit-line, a first switching means for shunting said electrical charge storing means during a sensing phase of said sense amplifier, a second switching means for coupling said bit-line to said electrical charge storing means during a latching phase of said sense amplifier, and a signal path selection means for coupling said bit-line to said sense amplifier during said sensing phase.

14. The sense amplifier of claim 13, wherein said biasing means further comprises a PMOS transistor coupled in series to an NMOS transistor.

15. The sense amplifier of claim 13, wherein said buffering means further comprises:

a first inverter coupled in series to a second inverter, a third inverter, and a fourth inverter, each inverter having a PMOS transistor and an NMOS transistor;

an output terminal of said first inverter being coupled to an input of said second inverter, an output terminal of the second inverter being coupled to an input of the third inverter, and an output terminal of said third inverter being coupled to an input terminal of said fourth inverter; and an output terminal of said fourth inverter forming an output terminal of said sense amplifier.

16. The sense amplifier of claim 13 wherein said feedback means further comprises an NMOS transistor coupled in parallel to a PMOS transistor.

17. The sense amplifier of claim 13, wherein a magnitude of said electrical charge storing means is proportional to a supply voltage of said sense amplifier.

18. A method of compensating electrical charge associated with a sense amplifier, comprising:

calculating a value of a compensating capacitor proportional to a supply voltage of said sense amplifier;

shunting said compensating capacitor during a sensing phase of said sense amplifier;

coupling a bit-line to said sense amplifier during said sensing phase of said sense amplifier; and coupling said bit-line to said compensating capacitor during a latching phase of said sense amplifier.

19. The method of claim 18, wherein the step of calculating a value of a compensating capacitor further comprises calculating said value of said compensating capacitor at different values of said supply voltage based on a high logic level input voltage.

20. The method of claim 18, wherein the step of calculating a value of a compensating capacitor further comprises choosing a value of compensating capacitor that is slightly larger than a maximum calculated value of said compensating capacitor.

21. The method of claim 18, wherein the step of calculating a value of a compensating capacitor further comprises calculating said value for said compensating capacitor for various temperatures.

22. The method of claim 18, wherein the step of calculating a value of a compensating capacitor further comprises performing a logic-one to logic-one transition simulation with wake-up events in between at a given value of supply voltage.

23. The charge sharing compensator of claim 1, wherein said coupling of said bit-line to said electrical charge storing means is exclusive of said coupling of said bit-line to said sense amplifier.

* * * * *